Figure 1:
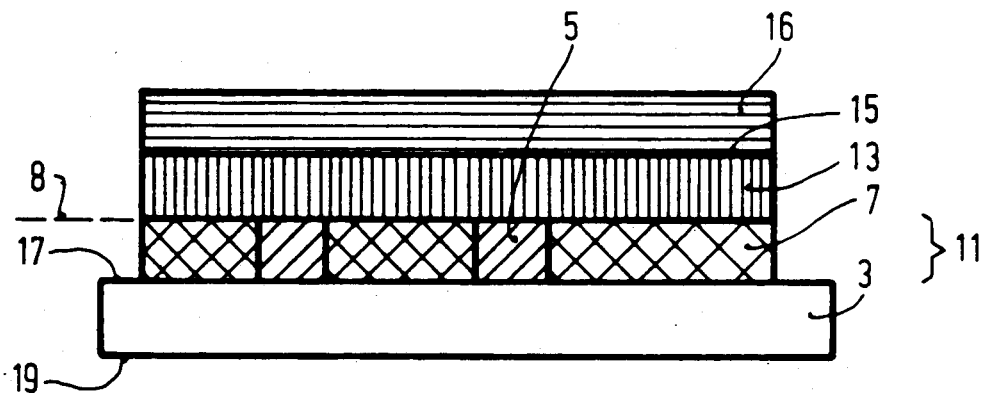

United States Patent [19]

Schnitker et al.

[11] Patent Number: 5,047,368
[45] Date of Patent: Sep. 10, 1991

[54] METHOD OF MANUFACTURING A THICK-FILM CIRCUIT ARRANGEMENT

[75] Inventors: Wolfgang E. Schnitker, Krefeld; Michael P. J. Nover, Essen; Kay Appel, Monchengladbach, all of Fed. Rep. of Germany

[73] Assignee: U.S. Philips Corporation, New York, N.Y.

[21] Appl. No.: 333,161

[22] Filed: Apr. 3, 1989

Related U.S. Application Data

[62] Division of Ser. No. 208,853, Jun. 14, 1988, Pat. No. 4,839,775.

[30] Foreign Application Priority Data

Jan. 31, 1986 [DE] Fed. Rep. of Germany ....... 3602960

[51] Int. Cl.$^5$ ............................................ H01L 21/56
[52] U.S. Cl. ................................. 437/213; 437/229; 437/235; 235/380; 427/96
[58] Field of Search ............... 437/211, 211 A, 211 T, 437/211 D, 213, 229, 235; 283/83, 904; 428/76, 208; 235/380; 427/96

[56] References Cited

U.S. PATENT DOCUMENTS

| | | | |
|---|---|---|---|
| 3,564,214 | 2/1971 | Cooper | 101/369 |
| 4,202,007 | 5/1980 | Douherty et al. | 174/260 |
| 4,434,361 | 2/1984 | Meinguss et al. | 340/825.33 |
| 4,487,993 | 12/1984 | Becker | 174/264 |
| 4,558,171 | 12/1985 | Gantley et al. | 174/52.4 |
| 4,650,923 | 3/1987 | Nishigaki et al. | 174/257 |
| 4,691,350 | 9/1987 | Kleijne et al. | 380/3 |
| 4,820,659 | 4/1989 | Dholakia et al. | 174/52.5 |
| 4,839,775 | 6/1989 | Schnitker | 361/402 |

FOREIGN PATENT DOCUMENTS

| | | | |
|---|---|---|---|
| 0131455 | 1/1985 | European Pat. Off. | 235/380 |
| 0185239 | 6/1986 | European Pat. Off. | 235/380 |
| 0197438 | 10/1986 | European Pat. Off. | 235/380 |
| 2016485 | 10/1971 | Fed. Rep. of Germany | |

Primary Examiner—Olik Chaudhuri
Assistant Examiner—Andrew Guiffis
Attorney, Agent, or Firm—Paul R. Miller

[57] ABSTRACT

The invention relates to a method of forming a thick-film circuit arrangement having an electronic circuit which is constructed on a surface (17) of a ceramic substrate plate (3) and which consists of conductor paths (5), resistors, capacitors and components, in particular integrated switching circuits without a housing, formed according to thick-film technique, in this structure has between the electrically conductive structures (5) a sintered, non-conductive paste substantially filling the intermediate spaces between them and both the structures and the interposed pastes are covered by a sintered insulating paste. For concealing the thick-film circuit arrangement from unauthorized access, the following covering construction is carried out:

1. the paste in the intermediate spaces fills the same between the electronically active thick-film conductor structures in such a manner that the tops of the electrically active structures and the insulating filling layer (7) formed from an insulating paste and filling the intermediate spaces between them are situated substantially in one plane, and the insulating paste is provided over the combined conductor/filling layer (11) in a covering and smoothing manner to form at least one insulating first thick-film anti-access layer (13) which, by additional observation-impeding inclusions (dye, particles), impedes an optical recognition of the underlying structures, especially when the first thick-film anti-access layer or layers is or are not succeeded by further anit-access layers.

13 Claims, 3 Drawing Sheets

METHOD OF MANUFACTURING A THICK-FILM CIRCUIT ARRANGEMENT

This application is a divisional of Ser. No. 07/208853, filed 6/14/88, now U.S. Pat. No. 4,839,775, and all benefits for such patent are hereby claimed for this divisional application.

The invention relates to a thick-film circuit arrangement having an electronic circuit which is constructed on a surface of a ceramic substrate plate and which consists of conductor paths, formed according to thick-film technology, as well as resistors, capacitors and components, in particular integrated circuits are provided without a housing, having a sintered, non-conductive paste substantially filling the intermediate spaces between the conductor structures and both, the conductor structures and the interposed paste are covered with a sintered insulating paste.

Such thick-film circuit arrangements are known from the book "Thick-Film Hybrid Microcircuit Technology", 1983, page 70, by D. W. Hamer and J. V. Biggers; and they are used to reach a high component density on comparatively small surface areas.

In these thick-film circuit boards which are formed from sintered layers on a ceramic substrate plate, the sintered insulating coverings consist substantially of glass; and they are used as so-called multi-layer arrangements to insulate crossing conductor paths in the overlapping area from each other. These insulating thick-film pastes covering conductor paths or resistors, when sintered, can withstand temperatures, above the decomposition temperature of organic substances and can withstand all known organic solvents. It is also known to coat thick-film circuits entirely or partly with a coating of an epoxy resin or other organic layers (for example, on the basis of silicone or polyurethane). However, these coatings conceal the underlying structures very unsatisfactorily. A person skilled in the art can remove these coatings without difficulties by heating or dissolving or by a combination of these softening methods, after which the total structure of the thick-film circuit with conductor paths and components is exposed.

The known thick-film circuit arrangements are constructed so that third parties, who either want to copy the circuit arrangement or, for example, want to obtain on electronic signals or storage data of the circuit arrangement or subsequent circuit units, can scan with simple means, for example, via test probes by means of scratching or drilling, and obtain all that is interesting for them. Within the scope of increasing electronic data storage, for example, in banking businesses or authorities, the problem presents itself, that persons who are interested in the data, for example, bank accounts, personnel data, or the like, will try to obtain illegally such data. Therefore, it becomes more and more important that access to circuit arrangements which respectively electrically process, convert and encode data worthy of protection is impeded as much as possible. The higher the access safety of such circuit arrangements and their internal data guiding systems, the more expensive the intellectual and machine investments that will be used by so-called intruders to obtain desired information upon of functioning of the circuit arrangement and to optionally perform operations by optical analyses such as , observation in transmitted light, exposure to, for example, X-rays or the reading of electric signals.

It is the object of the invention to improve the access safety of a thick-film circuit arrangement in such a manner that the time, which is necessary for intruding into the circuit arrangement, i.e. to find out the complete mode of operation of the circuit arrangement by obtaining the conductor path pattern between the individual components as well as the reading of the electrical signals, is considerably increased in accordance with the desired safety requirements and that in the case of higher safety requirements the technique and time available for intruding into the circuit arrangement also exceed the span which is available for professionals as much as possible.

According to the invention this object is achieved in that for covering the circuit arrangement essential parts thereof, the following construction for covering is used:

1. the paste in the intermediate spaces fills the spaces between the electrically operative thick-film structures in such a manner that the tops of the electrically active structures and of the insulating filling layer formed from an insulating paste, and filling the intermediate spaces between them, are situated substantially in one plane, and
2. the insulating paste is provided over the combined conductor/filling layer according to 1) in a covering and smoothing manner form at least one insulating first thick-film anti-access layer which, by additional observation-impeding inclusions (dye, particles), impedes optical recognition of the underlying structures, especially when the first thick-film anti-access layer is not succeeded by further anti-access layers of different structures.

It is known per se from the already mentioned book "Thick-Film Hybrid Microcircuit Technology", page 70, to provide between the sintered conductor structures a sintered, non-conductive paste which substantially fills the intermediate spaces between them and to coat both the conductor structures and the interposed paste with an insulating paste. However, such insulating structures only serve to provide the distance to overlying conductor structures for the same circuit arrangement.

Such a thick-film arrangement is safeguarded against unauthorized access to a considerable extent. For unauthorized access it would be important that first the circuit pattern and hence the connections between the concrete components can be established. Recognition is considerably impeded by a substantially flat surface of the thick-film substrate plate. By dyeing the paste and/or insulating particle inclusions to be sintered the possibility of observing the circuit arrangement is precluded.

According to a further embodiment of the invention it is provided that the first thick-film anti-access layer is covered by at least one second thick-film anti-access layer which is constructed so as to be at least partly superficially conductive and/or at least partly comprise conductor structures which are electrically operative and/or inoperative.

It is known per se from the book "Thick-Film Hybrid Microcircuit Technology", 1983, page 70, to provide a second conductor structure over the insulating layer; however, since this second conductor relates to conductor bridges, it forms part of the underlying first conductor structure.

According to a further embodiment of the invention the layer structure and the coating of the second thick-film anti-access layer, in so far as conductor structures are present, is done in accordance with the characterizing features of claim 1) and 2) described above. In this manner, unauthorized access is even further impeded.

According to a further embodiment of the invention the layer structure according to the characterising feature described above and optionally below this structure 1 is repeated at least once over each other. In this manner, a multilayer conductor structure can be achieved within the scope of improved access safety.

According to a further embodiment of the invention a second thick-film anti-access layer is constructed in the form of electrically conductive structures which at least partly engage in the electronic circuit of the circuit arrangement at places which are specific of the function. Preferably this may be done in such a manner that the second thick-film anti-access layer engages the electronic circuit of the circuit arrangement in such a manner that, in the case of interruptions or short-circuits of the structures of the second anti-access layer, functional defects, such as, storage loss or storage erasing, are produced in integrated circuits of the circuit arrangement. In this connection it is also possible that the original conductor structures of the circuit arrangement and the overlying anti-access structures are formed so that, in the case of examination with rays penetrating through the material, the functioning of the structures cannot be recognized. The analysis of circuit arrangements with improved access safety against X-rays, or other ionising rays, is thus considerably impeded. For further improvement of the access safety one or more of the second thick-film anti-access layers may be combined.

According to a further embodiment of the invention a circuit construction with a covering in the same manner as on the front is provided on the rear side of the ceramic substrate plate. It is also possible, however, that at least one second thick-film anti-access layer, optionally in combination with at least one filling or a first anti-access layer, is provided the rear side of the substrate plate. In this manner it is avoided that an intruder may obtain on the actual circuit pattern from the rear side of the ceramic substrate plate.

According to a further embodiment of the invention the thick-film filling layer which fills the intermediate spaces of the electrically operative thick-film structure is a sintered thick-film glass layer. According to a further embodiment of the invention it is also possible that the covering and smoothing first thick-film anti-access layer consists of a sintered thick-film glass layer. In this manner, for achieving access safety, known film formation within scope of the thick-film technology may be used.

The second anti-access layer can be formed in various ways depending on how high are the requirements for the access safety. For example, if only parts of the circuit arrangement are in danger, the second thick-film anti-access layer is formed entirely, or in one or several surfaces, from a sintered thick-film conductor and/or resistor paste. When the safety requirements are increased, the structures of the second anti-access layers are formed as a meander, pattern as comb pattern as a spiral pattern or as circuit patterns. A further improvement of access safety is achieved when the conductors of the circuit patterns from the second anti-access layer for purposes of delusion form connections which are necessary and/or superfluous for the functions of the circuit patterns and/or which simulate a different function.

Figure 2:
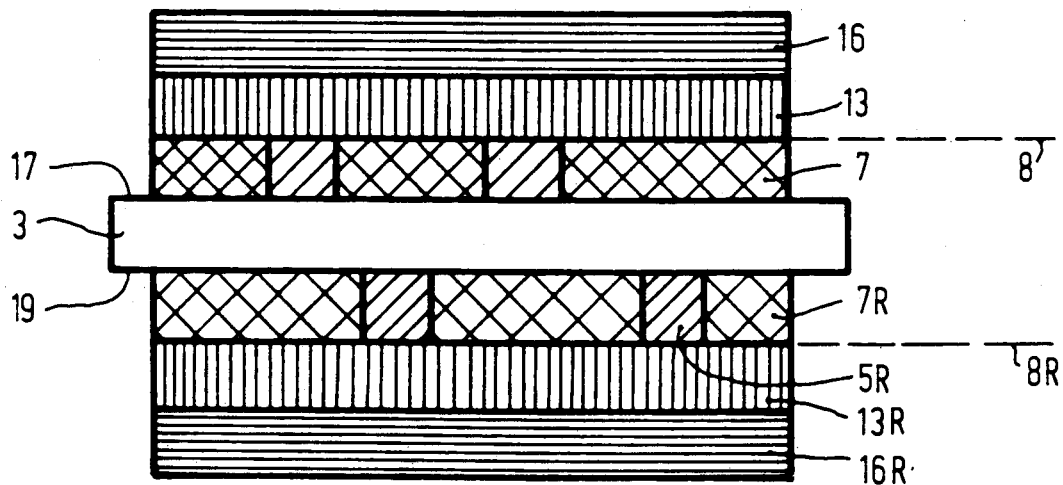
Figure 5:
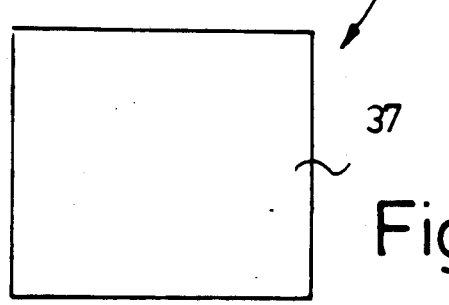
Figure 3:
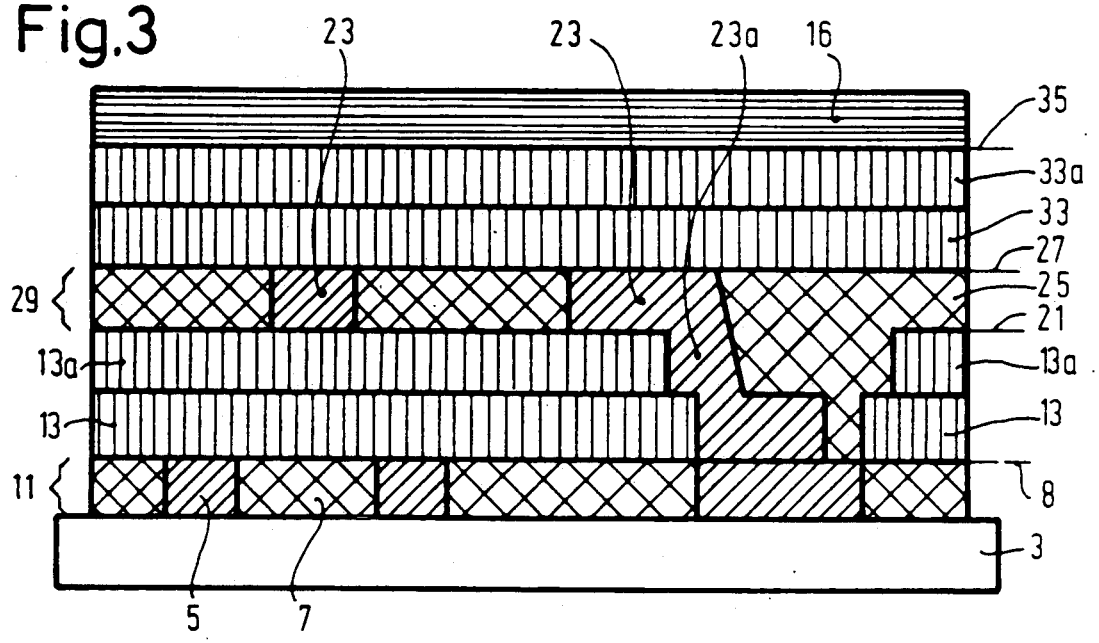
Figure 4:
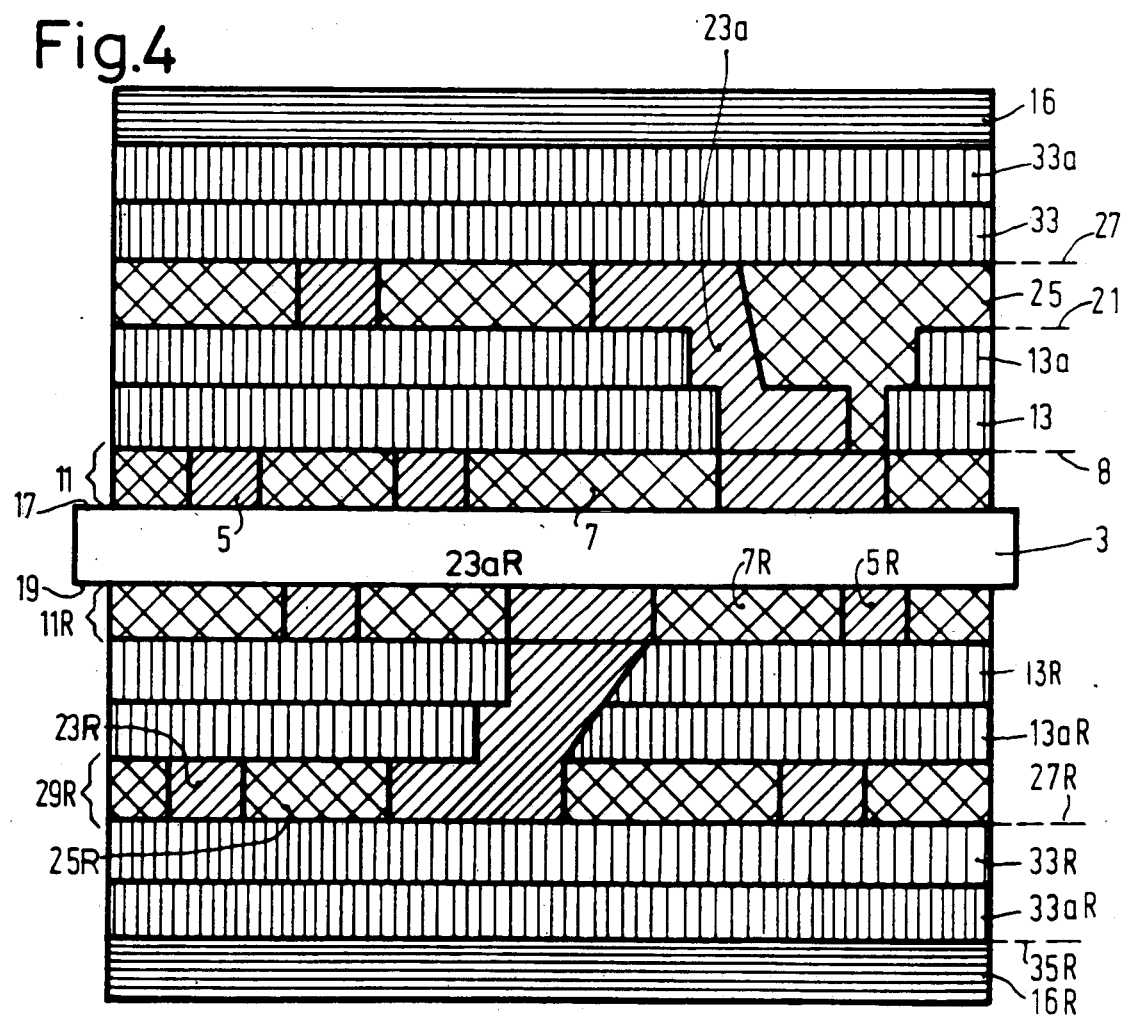
Figure 6:
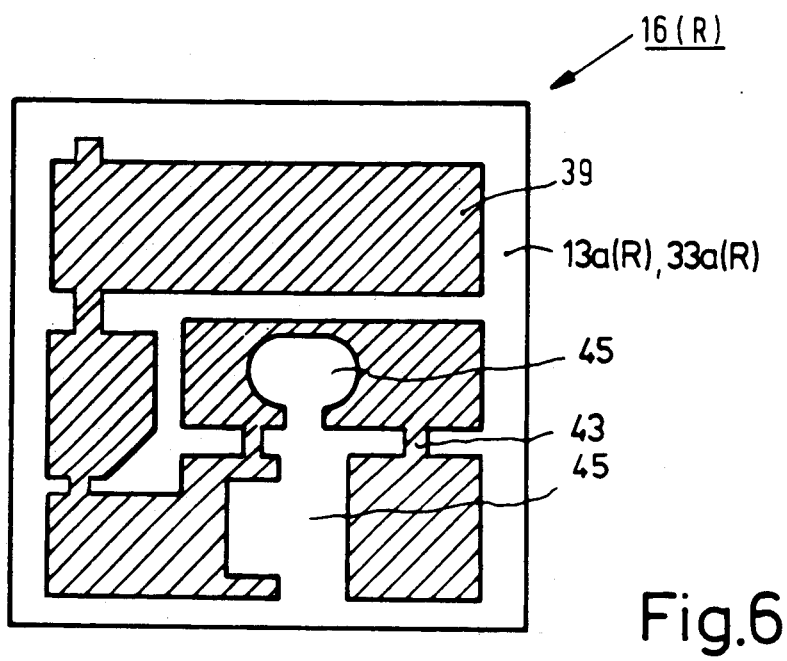

The invention will now be described in greater detail with reference to the drawings, in which FIG. 1 shows a ceramic substrate plate safeguarded against unauthorized access and having a conductor path layer, a filling layer and a smoothing layer on a surface of the plate, FIG. 2 shows a ceramic substrate plate according to FIG. 1 having a similar circuit structure on both surfaces to safeguard the circuit arrangement against access, FIG. 3 shows a ceramic substrate plate according to FIG. 1 having a multiple conductor path system with multiple compensating layers, FIG. 4 shows a ceramic substrate plate according to FIG. 3 having a similar construction on both surfaces, FIG. 5 is a plan view of an example of a second substantially flat anti-access layer, FIG. 6 shows a second anti-access layer having an electric structure.

Figure 7:
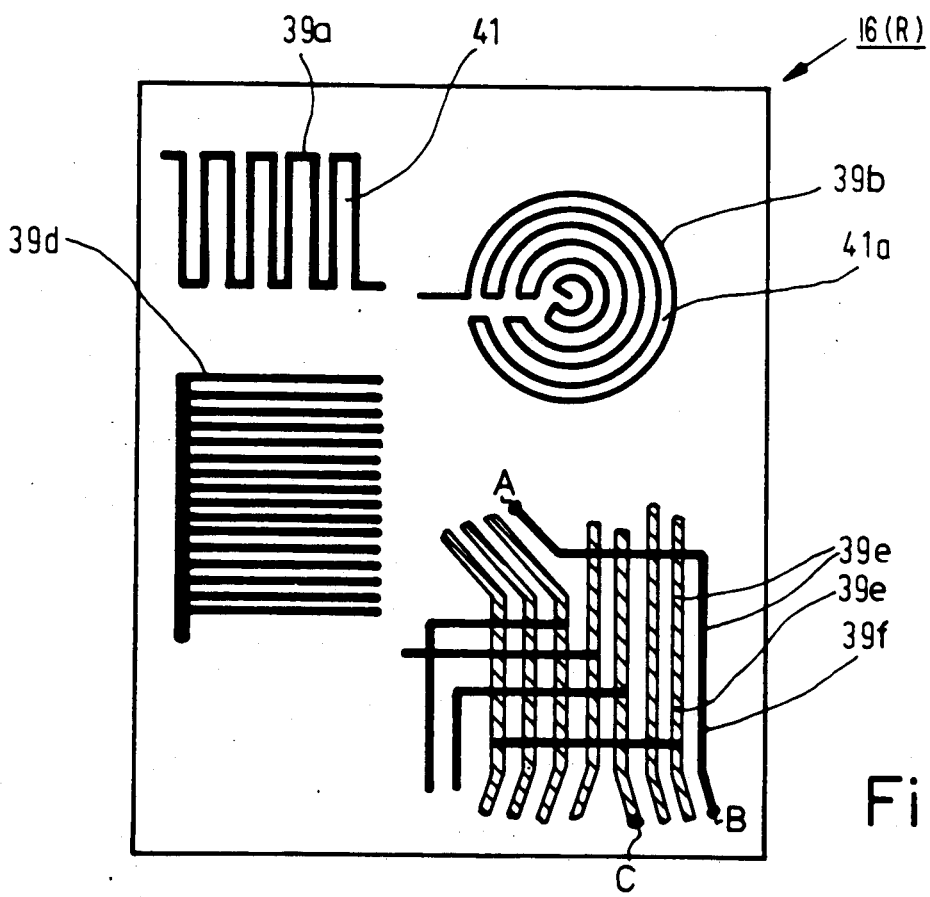

FIG. 7 is an example of a substantially structured anti-access layer having several variants of electric conductor structures.

In order to safeguard a thick-film circuit arrangement on a thick-film substrate plate 3 against unauthorized access, for example by intruders, the layers are formed in a particular manner on a substrate plate 3 shown in FIG. 1.

First of all the conductor paths 5, which are formed by sintering a conductive paste, are present directly on the substrate plate. The intermediate spaces between the conductor paths are filled with a thick-film filling layer 7 which is formed by sintering a non-conductive thick-film paste. This paste is the starting basis of the filling layer and is provided in the intermediate spaces between the conductor paths 5. The thick-film paste 7 may be, for example, a thick-film glass paste. The tops of the conductor paths 5 and of the filling layer 7 filling the intermediate spaces between the conductor paths are situated in a plane 8 extending substantially above parts of the substrate plate to be covered. This combined conductor-filling layer 11 is covered by means of an insulating first thick-film anti-access layer 13 which will hereinafter be referred to as smoothing layer 13. The smoothing layer 13 extends in a covering manner over the combined conductor and filling layer 11. The top 15 of the smoothing layer 13 is smooth. The formation of said smoothing layer 13 may be done, for example, by first providing an insulating thick-film paste substantially over the entire surface of the substrate plate 3 in a surface-covering manner, it being ensured that the paste flows uniformly to form a flat top surface 15. A second thick-film anti-access layer 16 which will hereinafter be referred to as functional layer 16 and will be explained in greater detail hereinafter is provided on to the top. The functional layer 16 may additionally obscure the underlying arrangement in accordance with requirements of the access safety.

While the covering provided on the surface 17 of the ceramic plate 13 protects the circuit arrangement of the surface 17, the circuit arrangement is protected at the opposite surface 19 by the ceramic substrate plate 3. The ceramic substrate plate 3 consists of a continuous uniform material through which in principle information on the mode of funtioning of the circuit arrangement could be read on the surface 17 by means of suitable methods, for example, drilling. In order to further increase access safety of the circuit arrangement better than the protection already resulting from the material property of the ceramic substrate plate, both the surface 17 and the opposite surface 19 of the ceramic circuit plate 3 may be provided with an anti-access covering in the embodiment shown in FIG. 2. The construction of the anti-access structure on the opposite surface 19 should preferably correspond to the construction on the surface 17. Accordingly, conductor paths 5R are provided on the opposite surface 19 of the ceramic circuit plate. The cavities between the conductor paths 5R are filled by means of the filling layer or second anti-access layer 7R. An insulating smoothing layer or anti-access layer 13R is provided on the resulting plane 8R. A functional layer 16R is present over the anti-access layer 13R.

In thick-film circuit arrangements it is generally inevitable, due to the compact wiring, that there are several conductor path planes. Different conductor path planes are formed so that the conductor situated thereon at the crossing area is separated from the underlying conductor by typically two interposed insulating layers lying one on top of the other. The insulating layers consist, for example, of thick-film glass pastes. It is shown in FIG. 3 how in the present thick-film circuit arrangement a flat covering is provided by means of two smoothing or anti-access layers 13 and 13a over the parts of the substrate plate 3 to be covered. This is of advantage because during sintering unevenesses may be again formed which unevenesses can be better smoothed by two smoothing layers 13 and 13a. The two smoothing layers 13 and 13a are formed in the same manner. On the top 21 of the flat smoothing layer 13a a further conductor path plane may be provided. The conductors 23 of this plane may be contacted in the desired places to underlying conductors 5 by a bridge 23a. The intermediate spaces between the conductors 23 are also filled with a filling material or layer 25 so that the surface 27 of the combined layer 29 of conductors 23 and filling material 25 is substantially smooth over the parts of the ceramic substrate plate 3 to be covered.

The combined conductor/filling layer 29 is now covered again by means of at least one, preferably two, additional smoothing layers 33 and 33a which are formed in the same manner and have a flat surface just like the smoothing layers 13 and 13a. In this manner a coating has been formed whose conductor pattern cannot be recognized from without or cannot be established by simple scratching or drilling the surface of the device.

In order to further improve access safety a functional layer 16, which is a further anti-access layer as above, is provided on the top 35 of the smoothing layer 33a. The functional layer 16 may again be formed differently.

FIG. 4 shows, similar FIG. 2, a construction in which on the surface 17 a coating according to FIG. 3 is provided and which is completed on the opposite surface 19 by a corresponding layer according to FIG. 3. Accordingly, a layer 11R with conductors 5R between which filling material or layer 7R is provided, is present on the opposite surface 19 as well as on the surface 17. The layer 11R is covered by smoothing or anti-access layers 13R and 13aR. Over the layer 13aR a further combined conductor or filling layer 29R with conductors 23R and the filling material 25R filling the intermediate spaces is present. The surface 27R is covered with smoothing or anti-access layers 33R and 33aR. The surface 35R of the smoothing or anti-access layer 33aR is then covered with a functional or anti-access layer 16R. As on the side, on which a bridge 23a is shown, a bridge 23aR is also provided on the opposite rear side.

A simple construction of functional anti-access layers 16 and 16R, respectively, is shown in FIG. 5. In this case the functional layer 16(R) consists of an electrically conductive layer 37, which is provided over a large area, and also for example, consists of a sintered thick-film resistance material.

FIG. 6 shows a functional anti-access layer 16(R) which has a simple conductor structure 39. Areas to be protected are covered above the top compensating layer 13R or 33aR with sintered resistance surfaces 39. The individual resistance surfaces are connected together via conductor paths 43. Special recesses 45 are present, for example, at locations of integrated circuits. These are provided only after sintering the substrate and, for example, are covered with epoxy resin.

FIG. 7 shows another embodiment of the functional or anti-access layers 16 and 16R, respectively. This functional layer 16R consists, as shown in the Figure, at the top left, either in part or totally, of a meander-like conductive layer 39a which either has a certain inner resistance (resistance pastes) or is completely conductive (conductor path pastes). The intermediate spaces between these structures may again be filled, as in the preceding Figures, with filling material 41 in accordance with the layers 11R and 29R. As shown in FIG. 7, at the top right, the conductor path may also be formed helically as indicated by 39b. Intermediate spaces 41a are also filled with filling material in accordance with layers 11R and 29R. FIG. 7, bottom left, shows the conductor structure 39d in the form of a comb.

In the right at the bottom part of FIG. 7 an embodiment is shown of the functional or anti-access layer 16 which has for its object to prevent the gaining of information about the circuit arrangement with rays penetrating through the material, such as X-rays.

At least the hatched structures 39e are to be provided in this case in such a manner that they are not visually recognizable. Due to the small distance to the solid structures 39f of an overlying layer of conductor structures these cannot be separated spatially from the upper structures in the direction at right angles to the substrate plate by means of known arrangements for analysis with penetrating rays. It can not be recognized by such techniques if, partial structures are electrically conductively connected together. These structures may also be used with large or small areas.

Another embodiment for this purpose may consist in that similar material is provided in an upper structure which is visually not recognizable at the area of the intermediate spaces between the parts of the lower structure. In this case a flat similar area is obtained which does not show inner structures with penetrating rays.

Also the arrangement shown in FIG. 7, lower right, is shown structured as a kind of confusion circuit. The construction may be chosen to be so that parts of the functional layer are integrated in the pattern of conductors. In a further modified embodiment it is feasible to provide the conductors of the confusing circuit in such a manner that, in the path of radiation of the rays penetrating through material in the original circuit, circuit arrangements are shown which actually do not exist.

The geometrical construction of the functional anti-access layer may also be chosen so that by its presence the original pattern is concealed, or that it cannot be recognized in transmission how the original pattern is constructed. Also it cannot be recognized in transmission whether the conductor connection between a point A and B or between A and C exists since in transmission a superposition and bifurcation of the original and the imaginary conductor paths is present, and in transmission a distinction between top and bottom is not possible as a result of the small difference in height of a few micrometers.

Summarizing, it may be said with reference to FIG. 7, bottom right, that the functional layer structures with respect to the underlying original conductor path structures are constructed so that in a parallel projection of the functional layer structure on the original conductor path structural linkages between the individual components of the circuit arrangement occur as the sum of the two structures which, for a third party not knowing the mode of functioning of the circuit, cannot be established as such. In this arrangement electric linkages are suggested only by the correspondingly structured functional layer. This functional layer sample, which is constructed and positioned in accordance with the original conductor pattern sample of the circuit arrangement by penetrating ray investigations, impedes analysis of the X-ray patterns of the circuit arrangement to a high extent. This is particularly important since an absolute protection against penetrating ray investigations is not possible according to the present state of the art. Lead covers also are unsafe, since they are necessarily very thin, and hence, not completely absorbing. They therefore cannot be bonded to the sintered pastes also as to be undetachable. Also what matters is that so much confusion is provided in the transmission that decoding requires too much work and time so that intentions to interfere or to encode third parties fade away and induces to stop the attempt.

This also applies to the case of mechanical and electrical test experiments when the conductor structures, such as 39 to 39f in FIGS. 6 and 7, engage in the electronic circuit of the circuit arrangement in functional-specific places. When the electrically conductive structures 39 to 39f are interrupted or short-circuited by such experiments, the circuit arrangement may be constructed so that either it stops functioning completely (for example, by loss of memory) or even is moved to produce an error function (wrong programming) by the manipulation. When, example, the circuit function is then changed, for example, in that, by triggering a reset function, storage capacity is erased or processors are moved in a position in which the original function can no longer be recognized, or also, by excess voltages and currents then occurring, the function of central components may be disturbed or destroyed. Several types of conductor paths of the functional or anti-access layer 16R may be combined with each other. This is advantageous where the voltage supply for the integrated switching circuits occur through the functional or anti-access layer or layers. Interference of such supply may lead to the irreparable defects such as already described.

What is claimed is:

1. A method of manufacturing a thick-film circuit arrangement comprising the steps of
   forming at least one thick-film conductor arrangement of conductor paths and integrated circuits on a first surface of a ceramic substrate,
   filling intermediate spaces between said conductor paths and integrated circuits with a sintered non-conducting paste of a thick-film glass material, said thick-film conductor arrangement and said sintered non-conducting paste extending to substantially the same height above said ceramic substrate to form a first planar surface,
   forming at least one layer of a thick-film anti-access material on said first planar surface over said thick-film conductor arrangement and said sintered non-conducting paste, and
   providing observation impeding inclusions in said thick-film anti-access material to prevent optical recognition of said thick-film conductor arrangement.

2. A method according to claim 1, wherein at least a second layer of thick-film anti-access material is formed over said at least one layer of a thick-film anti-access material.

3. A method according to claim 2, wherein at least a second thick-film conductor arrangement and at least a second sintered non-conducting paste are formed over said second layer of said thick-film anti-access material to form a second planar surface, and wherein at least a third layer of a thick-film anti-access material is formed over said second thick-film conductor arrangement and said second sintered non-conductive paste on said planar surface.

4. A method according to claim 3, wherein a fourth layer of a thick-film anti-access layer is formed over said third layer of a thick-film anti-access material.

5. A method according to claim 1, or claim 2 or claim 3 or claim 4, wherein electrically conductive structures are formed in at least outwardly formed layers of said thick-film anti-access material, said electrically conductive structures at least partially masking portions of said conductor paths and integrated circuits of underlying thick-film conductor arrangements.

6. A method according to claim 5, wherein said electrically conductive structure form functional errors of said conductor paths and integrated circuit components during interruptions of said underlying thick-film conductor arrangements.

7. A method according to claim 6, wherein said functional errors include at least one of loss of memory and erasing of memory in said integrated circuits.

8. A method according to claim 5, wherein said electrical conductive structures produce one of apparent normal connections, superfluous connections, and simulate different functions.

9. A method according to claim 5, wherein said electrical conductive structures supply voltage and current to said integrated circuits.

10. A method according to claim 5, wherein said thick-film conductor arrangements and said layers of thick-film anti-access material are formed to prevent recognition of modes of operation upon examination with material penetrating rays.

11. A method according to claim 5, wherein multiple layers of said second thick-film anti-access layer are combined.

12. A method according to claim 5, wherein at least one further thick-film conductor arrangement and further sintered non-conducting paste are formed on a second surface of said ceramic substrate, and wherein at least one further layer of a thick-film anti-access material is formed on said further thick-film conductor arrangement and further sintered non-conducting paste.

13. A method according to claim 12, wherein at least a second further layer of a thick-film anti-access material is formed on said at least one further layer of a thick-film anti-access material.

* * * * *